United States Patent
Chebi et al.

(10) Patent No.: US 9,330,926 B2
(45) Date of Patent: May 3, 2016

(54) FABRICATION OF A SILICON STRUCTURE AND DEEP SILICON ETCH WITH PROFILE CONTROL

(75) Inventors: Robert Chebi, San Carlos, CA (US); Frank Lin, Fremont, CA (US); Jaroslaw W. Winniczek, Daly City, CA (US); Wan-Lin Chen, Cupertino, CA (US); Erin McDonnell, Newark, CA (US); Lily Zheng, Fremont, CA (US); Stephan Lassig, Danville, CA (US); Jeff Bogart, Campbell, CA (US); Camelia Rusu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1452 days.

(21) Appl. No.: 12/338,950

(22) Filed: Dec. 18, 2008

(65) Prior Publication Data
US 2009/0184089 A1    Jul. 23, 2009

Related U.S. Application Data

(60) Provisional application No. 61/027,776, filed on Feb. 11, 2008, provisional application No. 61/016,369, filed on Dec. 21, 2007.

(51) Int. Cl.
| | |
|---|---|
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |
| *C23F 1/00* | (2006.01) |
| *H01L 21/3065* | (2006.01) |
| *H01J 37/32* | (2006.01) |
| *H01L 21/02* | (2006.01) |
| *H01L 21/311* | (2006.01) |
| *H01L 21/3213* | (2006.01) |

(52) U.S. Cl.
CPC ......... *H01L 21/3065* (2013.01); *H01J 37/3244* (2013.01); *H01J 37/32449* (2013.01); *H01L 21/02057* (2013.01); *H01L 21/30655* (2013.01); *H01L 21/31116* (2013.01); *H01L 21/31138* (2013.01); *H01L 21/32136* (2013.01); *H01L 21/32137* (2013.01)

(58) Field of Classification Search
USPC .......................................... 216/72; 438/714
See application file for complete search history.

(56) References Cited

U.S. PATENT DOCUMENTS

| | | | |
|---|---|---|---|
| 5,863,376 | A | 1/1999 | Wicker et al. |
| 5,904,520 | A | 5/1999 | Liaw et al. |

(Continued)

FOREIGN PATENT DOCUMENTS

| | | |
|---|---|---|
| JP | 11-97414 | 4/1999 |
| JP | 2001-319925 | 11/2001 |
| KR | 2000-0064946 | 11/2000 |

OTHER PUBLICATIONS

Search Report dated Jun. 24, 2009 from International Application No. PCT/US2008/086722.

(Continued)

*Primary Examiner* — Thomas Pham
(74) *Attorney, Agent, or Firm* — Beyer Law Group LLP

(57) ABSTRACT

A method of etching features into a silicon layer with a steady-state gas flow is provided. An etch gas comprising an oxygen containing gas and a fluorine containing gas is provided. A plasma is provided from the etch gas. Then, the flow of the etch gas is stopped.

32 Claims, 11 Drawing Sheets

(56) References Cited

U.S. PATENT DOCUMENTS

| | | | |
|---|---|---|---|
| 6,127,278 | A | 10/2000 | Wang et al. |
| 6,225,228 | B1 | 5/2001 | Srinivasan |
| 6,284,666 | B1* | 9/2001 | Naeem et al. ............... 438/713 |
| 6,387,804 | B1 | 5/2002 | Foster |
| 6,458,648 | B1 | 10/2002 | Molloy et al. |
| 6,491,835 | B1 | 12/2002 | Kumar et al. |
| 7,129,178 | B1* | 10/2006 | Schwarz et al. ............. 438/706 |
| 7,169,255 | B2 | 1/2007 | Yasui et al. |
| 2002/0009891 | A1* | 1/2002 | Ting et al. .................... 438/706 |
| 2002/0061621 | A1* | 5/2002 | Grebs et al. .................. 438/243 |
| 2002/0179570 | A1 | 12/2002 | Mathad et al. |
| 2003/0022512 | A1* | 1/2003 | Saito et al. ................... 438/710 |
| 2003/0162407 | A1 | 8/2003 | Maex et al. |
| 2003/0232504 | A1 | 12/2003 | Eppler et al. |
| 2004/0221797 | A1* | 11/2004 | Mosden et al. ................. 117/84 |
| 2004/0222190 | A1 | 11/2004 | Horiguchi et al. |
| 2004/0241342 | A1 | 12/2004 | Karim et al. |
| 2005/0014372 | A1* | 1/2005 | Shimonishi et al. .......... 438/689 |
| 2005/0056941 | A1 | 3/2005 | Vanhaelemeersch et al. |
| 2005/0126710 | A1* | 6/2005 | Laermer et al. .......... 156/345.33 |
| 2005/0136682 | A1 | 6/2005 | Hudson et al. |
| 2005/0142828 | A1 | 6/2005 | Kammler et al. |
| 2005/0158975 | A1 | 7/2005 | Liu et al. |
| 2006/0219174 | A1 | 10/2006 | Nguyen et al. |
| 2006/0228860 | A1* | 10/2006 | Shinohara et al. ............ 438/257 |
| 2007/0111467 | A1 | 5/2007 | Kim |
| 2007/0232071 | A1 | 10/2007 | Balseanu et al. |
| 2008/0020582 | A1 | 1/2008 | Bai |

OTHER PUBLICATIONS

Written Opinion dated Jun. 24, 2009 from International Application No. PCT/US2008/086722.

Search Report dated Apr. 22, 2010 from International Application No. PCT/US2009/060214.

Written Opinion dated Apr. 22, 2010 from International Application No. PCT/US2009/060214.

Search Report dated Apr. 22, 2010 from International Application No. PCT/US2009/060218.

Written Opinion dated Apr. 22, 2010 from International Application No. PCT/US2009/060218.

Office Action dated May 27, 2011 from U.S. Appl. No. 12/257,215.

Final Office Action dated Sep. 29, 2011 from U.S. Appl. No. 12/257,215.

Office Action dated Sep. 14, 2011 from U.S. Appl. No. 12/257,210.

Nishino et al., "Damage-free selective etching of Si native oxides using NH3/NF3 and SF6/H2O down-flow etching," Journal of Applied Physics, vol. 74, No. 2, 1993, pp. 1345-1348.

Written Opinion dated Mar. 14, 2012 from Singapore Patent Application No. 201004075-6.

Search Report dated Mar. 14, 2012 from Singapore Patent Application No. 201004075-6.

U.S. Appl. No. 12/257,210, filed Oct. 23, 2008.

U.S. Appl. No. 12/257,215, filed Oct. 23, 2008.

\* cited by examiner 304   340   FIG. 6

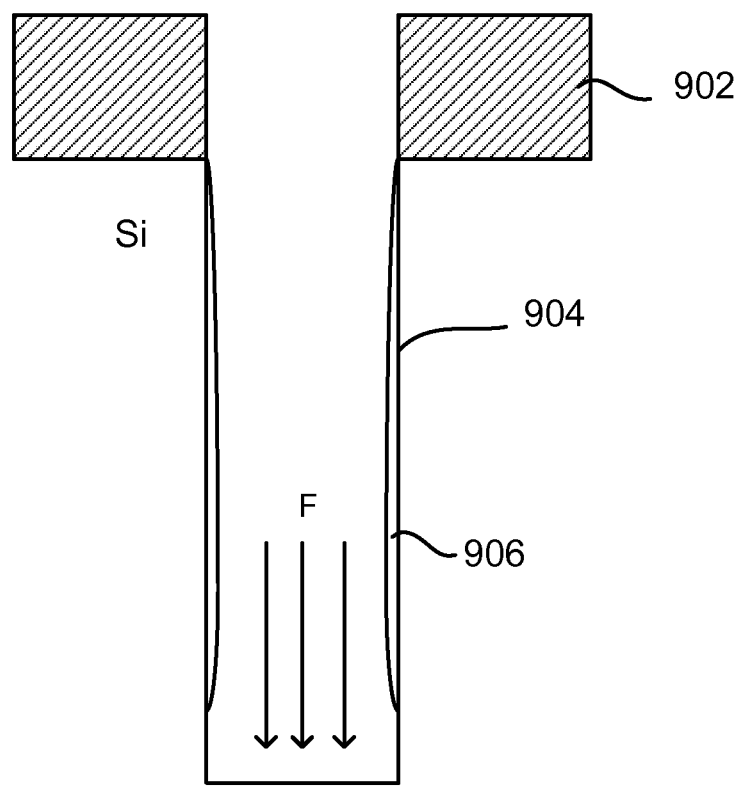
FIG. 9

FABRICATION OF A SILICON STRUCTURE AND DEEP SILICON ETCH WITH PROFILE CONTROL

This application claims the benefit of priority of U.S. Provisional Application No. 61/027,776, filed Feb. 11, 2008 and U.S. Provisional Application No. 61/016,369, filed Dec. 21, 2007, which are incorporated herein by reference.

BACKGROUND OF THE INVENTION

The present invention relates to the etching of features into different materials in plasma processing chambers. The present invention also relates to deep silicon etching.

Typically, materials etched in plasma reactors include conductive layers and dielectric layers. Conductive layers may be composed of, for example, metal-containing layers or silicon-containing layers. Dielectric layers may be composed of, for example, organic materials or inorganic materials.

Typically, a particular material is etched in a dedicated etch chamber. That is, dielectric layers are typically etched in dedicated dielectric etch chambers, silicon-containing layers are typically etched in conductor etch chambers, and metal-containing layers are typically etched in metal etch chambers.

Deep silicon etching based on the Bosch process originally developed by Robert Bosch GmbH involves fast switching between silicon etching and polymer deposition for silicon sidewall protection. $SF_6$ and $C_4F_8$ are the principal process gasses for the etch and deposition (passivation) cycles, respectively.

SUMMARY OF THE INVENTION

To achieve the foregoing and in accordance with the purpose of the present invention, in one embodiment, a method for etching patterned features into at least one conductive layer, at least one dielectric layer, and into a silicon substrate is provided. A silicon wafer is loaded into a process chamber, wherein the at least one conductive layer and the at least one dielectric layer is disposed over the silicon wafer. At least one conductive layer is etched, comprising flowing a conductive layer etch gas into the process chamber, forming a plasma from the conductive layer etch gas, etching the at least one conductive layer with the plasma formed from the conductive layer etch gas, and stopping the conductive layer etch gas flow. At least one dielectric layer is etched, comprising flowing a dielectric etch gas into the process chamber, forming a plasma from the dielectric etch gas, etching the at least one dielectric layer with the plasma formed from the dielectric etch gas, and stopping the dielectric layer etch gas flow. The silicon layer is etched, comprising flowing a silicon etch gas into the chamber, forming a plasma from the silicon etch gas, etching into the silicon wafer with the plasma formed from the silicon etch gas, and stopping the silicon etch gas flow. The wafer is unloaded from the process chamber.

In another manifestation of the invention a method of etching features into a silicon wafer with a steady-state gas flow is provided. A wafer is loaded into a plasma processing chamber. A steady-state gas flow comprising of $SF_6$, $SiF_4$, HBr, and $O_2$ is provided. A plasma is formed from the steady-state gas flow. The silicon wafer is etched with the plasma formed from the steady-state gas flow. The wafer is removed from the plasma processing chamber.

In another manifestation of the invention an apparatus for etching features into a conductive layer, a dielectric layer, and into a silicon substrate is provided. A plasma processing chamber is provided, comprising a vacuum chamber. A dielectric window forms a side of the vacuum chamber. At least one antenna is adjacent to the dielectric window for providing power for sustaining a plasma. At least one plasma power source is electrically connected to at least one antenna, wherein the power supply is able to provide over 5000 Watts. A dielectric window cooling system is provided, where the dielectric window is disposed to the dielectric window cooling system, which comprises of a cooling gas source, an enclosure wall spaced apart from the dielectric window to form an enclosure extending from the enclosure wall to the dielectric window, an input conduit which directs a cooling gas into the enclosure, an output conduit to direct the cooling gas flow from the enclosure, and a pump for moving the cooling gas through the input and output conduits. A substrate support is for supporting a silicon substrate within the plasma processing chamber. A pressure regulator for regulating the pressure in the plasma processing chamber. A gas inlet for providing gas into the plasma processing chamber. A gas outlet exhausts gas from the plasma processing chamber. A gas source is in fluid connection with the gas inlet.

In another manifestation of the invention an apparatus for etching features is provided. A plasma processing chamber is provided, which comprises a vacuum chamber, a dielectric window forming a side of the vacuum chamber; at least one antenna adjacent to the dielectric window for providing power for sustaining a plasma, at least one plasma power source electrically connected to at least one antenna, a substrate support for supporting a silicon substrate within the plasma processing chamber, a pressure regulator for regulating the pressure in the plasma processing chamber, a gas inlet for providing gas into the plasma processing chamber, and a gas outlet for exhausting gas from the plasma processing chamber. A gas source is in fluid connection with the gas inlet and comprises a conductive layer etch gas source, a dielectric layer etch gas source, and a silicon substrate etch gas source. A controller is controllably connected to the gas source and at least one antenna, and comprises at least one processor and computer readable media. The computer readable media comprises computer readable code for etching a conductive layer, comprising computer readable code for providing a conductive layer etch gas from the conductive layer etch gas source to the plasma processing chamber, computer readable code for transforming the conductive layer etch gas into a plasma, and computer readable code for stopping the conductive layer etch gas flow from the conductive layer etch gas source to the plasma processing chamber, computer readable code for etching a dielectric layer, comprising computer readable code for providing a dielectric layer etch gas from the dielectric layer etch gas source to the plasma processing chamber, computer readable code for transforming the dielectric layer etch gas into a plasma, and computer readable code for stopping the dielectric layer etch gas flow from the dielectric layer etch gas source to the plasma processing chamber, and computer readable code for etching into a silicon substrate, comprising computer readable code for providing a silicon substrate etch gas from the silicon substrate etch gas source to the plasma processing chamber, computer readable code for transforming the silicon substrate etch gas into a plasma, and computer readable code for stopping the silicon substrate etch gas flow from the conductive layer etch gas source to the plasma processing chamber.

In another manifestation of the invention, a method of etching features into a silicon layer with a steady-state gas flow is provided. An etch gas comprising an oxygen containing gas and a fluorine containing gas is provided. A plasma is provided from the etch gas. A bias voltage is provided and features are etched into the silicon layer using the plasma.

Then, the flow of the etch gas is stopped. The bias voltage may be equal to or greater than 5 volt. The oxygen containing gas may include at least one of $SO_2$, $CO_2$, CO, $NO_2$, or $N_2O$, and the etch gas may further contains $O_2$. The fluorine containing gas may include $SF_6$ or $NF_3$.

In another manifestation of the invention, an apparatus for etching features into a silicon layer is provided. The apparatus comprises a plasma processing chamber which includes a vacuum chamber, a dielectric window forming a side of the vacuum chamber, at least one antenna adjacent to the dielectric window for providing power for sustaining a plasma, at least one plasma power source electrically connected to the at least one antenna, a substrate support for supporting a silicon substrate within the plasma processing chamber, a pressure regulator for regulating the pressure in the plasma processing chamber, a gas inlet for providing gas into the plasma processing chamber, and a gas outlet for exhausting gas from the plasma processing chamber. The apparatus further comprises a gas source in fluid connection with the gas inlet. The gas sources include an oxygen containing gas source, a fluorine containing gas source, and an optional additive gas source. A controller is controllably connected to the gas source and the at least one antenna. The controller comprises at least one processor, and computer readable media. The computer readable media includes computer readable code for providing an etch gas from the gas source to the plasma processing chamber, the etch gas comprising an oxygen containing gas and a fluorine containing gas, computer readable code for generating a plasma from the etch gas, computer readable code for providing a bias voltage, computer readable code for etching features into the silicon layer using the plasma, and computer readable code for stopping the etch gas flowing from the gas source to the plasma processing chamber. The oxygen containing gas source may include a $SO_2$ gas source. The fluorine containing gas source may include a $SF_6$ gas source. The additive gas source comprises a $SiF_4$ gas source.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 9 is a schematic cross-sectional view illustrating deep silicon etch in accordance with one embodiment of the present invention.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Materials etched in plasma reactors include conductive layers and dielectric layers. Conductive layers may be composed of, for example, metal-containing layers or silicon-containing layers. Dielectric layers may be composed of, for example, organic or inorganic non-conductive materials. Typically, a particular material is etched in a dedicated etch chamber. That is, dielectric layers are typically etched in dedicated dielectric etch chambers, silicon-containing layers are typically etched in conductor etch chambers, and metal-containing layers are typically etched in metal etch chambers.

Multiple conductive and dielectric layers may be present on the surface of a silicon wafer, such as, for example, during the fabrication of CMOS devices. In some cases, it may be advantageous to etch through some or all of the existing multiple conductive and dielectric layers present on a wafer. For example, such conductive and dielectric layers may be etched through so as to allow the formation of a feature in the silicon substrate in a subsequent processing step. The use of separate, dedicated etch chambers to etch each individual conductive or dielectric layer may result in the wafer undergoing multiple processing steps in multiple etch chambers, which may result in significant additional cost and processing complexity. Therefore, it may be advantageous to etch all dielectric and conductor layers which may be present on a silicon wafer in a single chamber, and to use the same chamber for additional processes such as pre-treatments, post-treatments, and for etching features into the silicon substrate.

Figure 1:
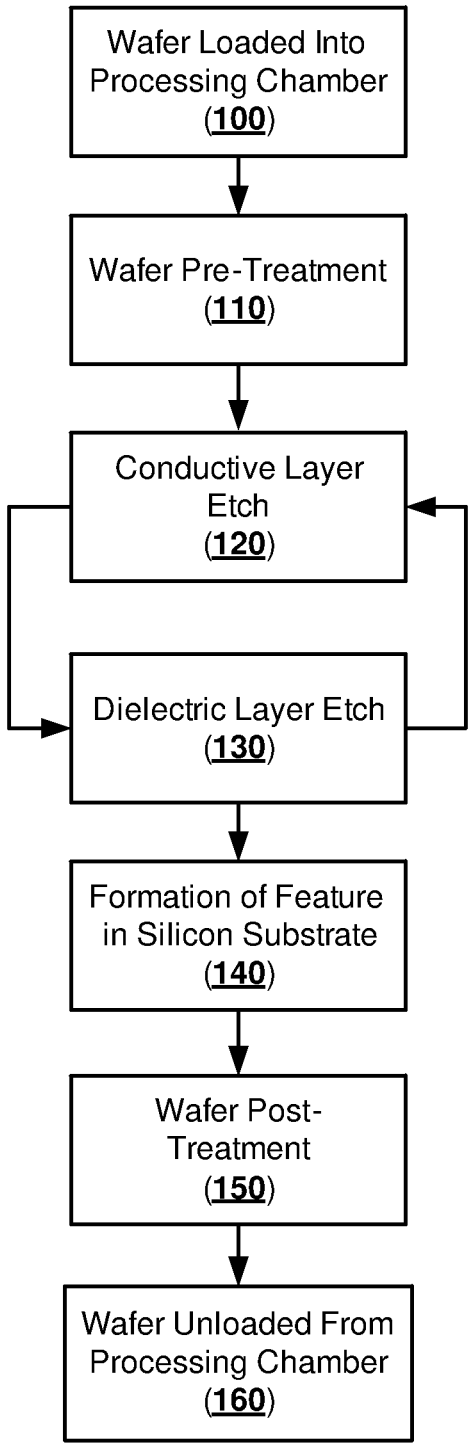
FIG. 1 is a high level flow chart of one embodiment of the invention.

To facilitate understanding, FIG. 1 is a high level flow chart of a process used in an embodiment of the invention. A wafer with patterned features disposed above at least one conductive layer and at least one dielectric layer disposed above the silicon substrate is loaded into a processing chamber (step 100). An optional pre-etch treatment process (step 110) may then be performed to prepare the surface for the next processing step. The conductive layer and the dielectric layer may then be etched (steps 120 and 130, respectively). If multiple conductive and/or dielectric layers are present on the wafer, steps 120 and 130 may be repeated as many times as is necessary to remove all the layers and expose the silicon substrate. Features may then be etched into the exposed silicon substrate (step 140) and an optional post-etch treatment process (step 150) may be performed before the wafer is unloaded from the processing chamber (step 160). In this embodiment, all the processing steps (i.e. step 100 through step 160) is performed in a single processing chamber.

Step 110, a wafer pre-etch treatment step, may be performed prior to the first etch step 120 if residue or surface damage is present on the wafer surface when the wafer is loaded into the processing chamber (step 100). The presence of residue on the surface of a wafer is generally very undesirable because residue can have a significant negative impact on the overall etch performance. For example, the presence of residue materials on the surface of a wafer may result in nonuniform etching of the underlying film or in the formation of discrete defects such as "pillars" or "grass" because the residue materials may etch more slowly than the underlying layer. Once such defects form, they may propagate through and interfere with every subsequent etch step. For example, if discrete defects form in a first conductive layer etch step (e.g. step 120), they may degrade the performance of a subsequent dielectric etch step (e.g. step 130) and propagate into a subsequent silicon substrate etch step (e.g. step 140).

Sources of residue may include previous processing steps such as plasma processes, wet chemical baths, and/or testing or probing of electrical circuits. In addition, exposure to an unclean ambient environment, or improper wafer handling or transport, may also result in contamination of the wafer surface with residue.

Residue may be inorganic-based, organic-based, or a combination of both. For example, inorganic-based residue from a silicon etch process may contain a combination of silicon and oxygen, or inorganic-based residue from a copper processing step may contain copper and oxygen. Examples of organic-based residue include residual photoresist from a lithography step, and/or deposited materials from a dielectric etch step such as, for example, combinations of carbon, hydrogen, and fluorine. In addition, residue may take the form of a coherent film or the form of discrete objects such as nodules, or a combination of both.

An appropriate plasma-based pre-treatment step (step 110) may be used to eliminate organic-based and inorganic-based residue. An example of a pre-treatment plasma process (step 110) for removal of organic-based residue process is 100 to 600 sccm of $O_2$, 20 to 200 sccm of $N_2$, 20 to 200 sccm of Ar, at a pressure of 50 to 200 mTorr with an applied TCP power of 1000 to 2500 Watts, and a bias voltage of 20 to 200 Volts. In all of the examples in the specification, the TCP power has a frequency of 13.56 MHz, although in other embodiments, other frequencies may be used.

An example of a pre-treatment plasma process (step 110) for removing inorganic residue is 100 to 600 sccm of $O_2$, 10 to 100 sccm of $CF_4$ and/or $CHF_3$ and/or $CH_3F$, 0 to 200 sccm of Ar, at a pressure of 50 to 200 mTorr with an applied TCP power of 1000 to 2500 Watts, and a bias voltage of 20 to 200 Volts.

In addition, a wafer pretreatment step (step 110) may also be used to eliminate defects present in the surface of the first layer to be etched. For example, testing of CMOS devices often requires a probe to come into physical contact with, as well as electrical current to flow through, copper and/or aluminum test pads. Such contact may result in damage such as scratches and/or the formation of work-hardened regions in the pad surface. Like residue, surface defects such as scratches or work-hardened regions may result in nonuniform etching of the layer underneath or in the formation of discrete defects in the underlying film such as "pillars" or "grass" which have the capability of interfering with the subsequent etching of underlying conductive layers (e.g. step 120), dielectric layers (e.g. step 130), as well etching of the silicon substrate (step 140).

An appropriate plasma-based pre-treatment step (step 110) may be used to eliminate defects present in the surface of the first layer to be etched. An example of a pre-treatment process to eliminate surface defects in a layer being etched is 50 to 300 sccm of $Cl_2$, 100 to 400 sccm of $BCl_3$, 0 to 100 sccm of $N_2$, at a pressure of 8 to 40 mTorr, with an applied TCP power of 800 to 2500 W, and a bias voltage 200 to 700 Volts.

As with surface residue, pre-etch treatment processes to remove surface defects are typically carried out in separate, dedicated processing chambers. Therefore, it may be advantageous to perform a defect-removing pre-treatment step (step 110) in the same chamber as the etch processes (e.g. steps 120, 130, and 140) to eliminate additional processing complexity and cost which may be associated with processing a wafer in a separate, dedicated processing chamber.

However, if residue and/or surface defects are not present, or if it may be advantageous for some other reason, the wafer pre-treatment step (step 110) may be omitted and conductive and dielectric layers may be etched (steps 120 and 130) directly after the wafer has been loaded into the plasma etch chamber (step 100).

Etching of conductive layers (step 120) and etching of dielectric layers (step 130) are also typically performed in different processing chambers. For example, a dielectric layer is typically etched in a dielectric etch chamber, a metal-containing conductive layer is typically etched in a metal etch chamber, and a silicon-containing conductive layer is typically etched in a silicon etch chamber. In many cases, there may be multiple conductive and/or dielectric layers present on a wafer, in which case it may be necessary to transport a wafer between many different chambers in order to etch through all the layers. In addition, the dedicated chambers may be situated in different physical locations. Therefore, etching of different layers in separate, dedicated etch chambers may result in significant additional processing cost and complexity. Conversely, etching each type of layer in a single plasma processing chamber may advantageously reduce processing cost and complexity.

With reference to FIG. 1, the conductive layer etch step 120 represent the total number of etch steps which may be needed to etch all the conductive layers present on a wafer. Similarly, the dielectric layer etch step 130 represents the total number of etch steps which may be needed to etch all the dielectric layers present on a wafer. As indicated by the arrows between step 120 and step 130, it may be advantageous to switch between conductive and dielectric etch steps as when, for example, multiple conductive and dielectric layers are present. That is, a wafer may have, for example, a minimum of one conductive layer and a minimum of one dielectric layer disposed over a silicon substrate, in which case conductive layer etch step 120 and dielectric layer etch step 130 may each be performed only once. Or, in another example, multiple conductive layers and multiple dielectric layers may be present and may be arranged over the silicon substrate in, for example, alternating layers, in which case there may be multiple conductive layer etch steps 120 interspersed with multiple dielectric layer etch steps 130.

Figure 2A:
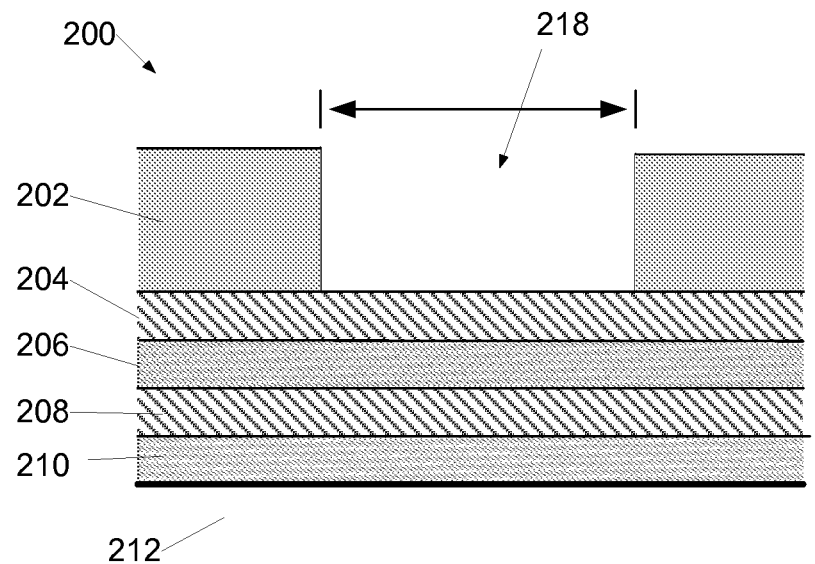
FIGS. 2A-C are schematic views of a stack processed according to an embodiment of the invention.

To facilitate understanding, FIG. 2A is an example of one embodiment of a patterned silicon wafer having multiple, interleaved conductive and dielectric device layers disposed above a silicon substrate. A wafer 200 with a patterned mask layer 202 defines a feature 218 on a surface layer 204. The mask layer 202 may be organic-based such as a photoresist or inorganic-based hardmask such as $SiO_2$ or $Si_3N_4$. Surface layer 204 may be, for example, a conductive layer containing a metal such tungsten, copper, and/or aluminum. Layer 206, disposed underneath conductive device layer 204, may be a dielectric layer such as, for example, silicon dioxide. Device layer 208, disposed below dielectric layer 206, may be another conductive layer but of a different material and/or composition than conductive layer 204; for example, conductive layer 208 may be a silicon-containing layer such as a silicide. Device layer 210, disposed below conductive layer 208 and above a silicon substrate 212, may be an additional dielectric layer such as a low-k dielectric material.

In one embodiment of the invention, the full layer stack (i.e. layers 204-210) may be etched with a sequence of layer-specific etch processes in the same plasma processing chamber. To continue with the example presented above, metal-containing conductive surface layer 204 may first be etched with a metal etch process (FIG. 1 step 120). An example of a metal etch process is that with pressure in the range of 8~20 mTorr, TCP power in the range of 1000~2500 watts, bias voltage in the range of 250~450 volt, gas mixture of $Cl_2/BCl_3$, and electrostatic chuck (ESC) temperature in the range of $-10°$ C.~$+10°$ C.

In a next step, dielectric layer 206 may be etched with a silicon dioxide dielectric etch process (FIG. 1 step 130). An example of a silicon dioxide dielectric etch process is performed by using pressure in the range of 20~40 mTorr, TCP power in the range of 2000~2500 watts, bias voltage in the range of 1000~1500 volt, ESC temperature in the range of $-10°$ C.~$+10°$ C., and the gas mixture of 100~300 sccm $CF_4$, 200~400 sccm $CHF_3$, 50~200 sccm Ar, and 0~100 sccm of $O_2$.

In a further step, silicon-containing conductive layer 208 may be etched with a conductive layer etch process (FIG. 1 step 120) which may be different than the conductive layer etch process used for layer 204. For example, layer 208 may be etched with a silicon etch process such as that with pressure in the range of 5~10 mTorr, TCP power in the range of 400~600 watts, bias voltage in the range of 150~250 volt, gas mixture of $Cl_2/NF_3/O_2/N_2$, or $Cl_2/CF_4/HBr$, and ESC temperature in the range of $-10°$ C.~$+10°$ C.

In an additional step, low k dielectric layer 210 may be etched with a dielectric layer etch process (FIG. 1 step 130) which may be different than the dielectric layer etch process used to etch layer 206. For example, layer 210 may be etched with a low-k dielectric etch process such as using pressure in the range of 3~50 mTorr, TCP power in the range of 150~700 watts, bias voltage in the range of 30~200 volt, ESC temperature in the range of $-10°$ C.~$+60°$ C., and the gas mixture of 50~200 sccm $CF_4$, 0~20 sccm $CH_2F_2$, and 0~15 sccm $O_2$.

Figure 2B:
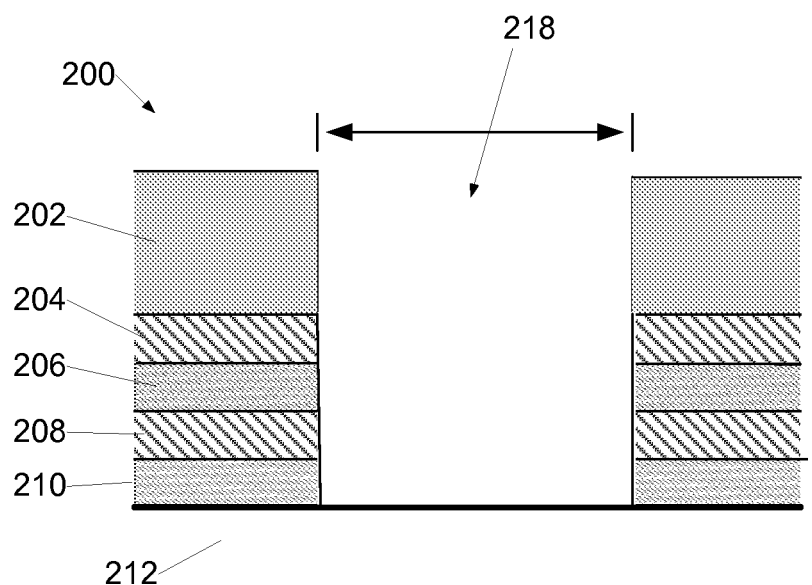

FIG. 2B represents layer stack 200 after the successive conductive layer and dielectric layer etch steps described above. Feature 218 has been etched through conductive layers 204 and 208 and dielectric layers 206 and 210 to expose silicon substrate 212 in a single plasma processing chamber, thus avoiding the cost and complexity associated with using dedicated etch chambers. It should be obvious to one skilled in the art that the specific number, sequence, and type of conductive layer etch steps (FIG. 1 step 120) and dielectric layer etch steps (FIG. 1 step 130) which need to be performed may change for different numbers, types, and combinations of conductive and dielectric layers which may be present on a wafer.

Figure 2C:
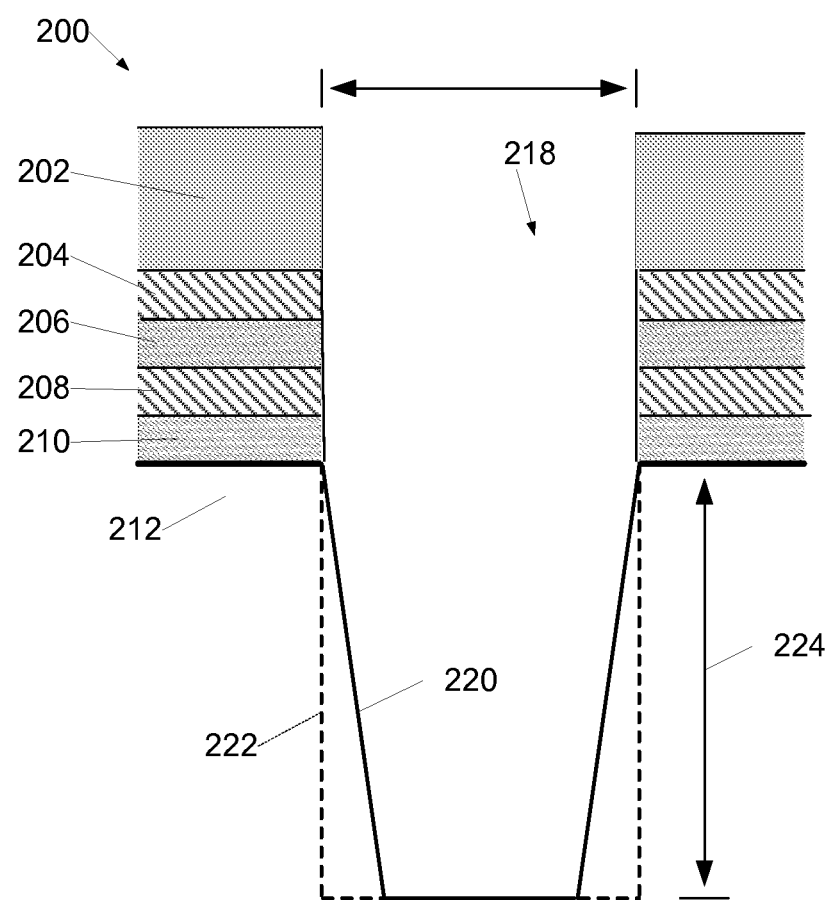

When the silicon substrate is exposed, features such as contacts, vias, and/or trenches may be formed (FIG. 1 step 140). To facilitate understanding, FIG. 2C is an example of a cross-section of a feature etched into a silicon substrate after multiple conductive and dielectric layers have been etched. Mask layer 202 defines a feature 218 on wafer 200. Layers 204, 206, 208, and 210 represent conductive and dielectric layers which may be present, and which may have been etched in previous steps (e.g. as described in previous paragraphs). It should be obvious to one skilled in the art that layers 204, 206, 208, and 210 are not required to form features into the silicon substrate. Feature 222 is an example of a feature 218 etched into silicon substrate 212 having a vertical (i.e. substantially 90 degree) profile angle; feature 220 represents a feature 218 etched into a silicon substrate 212 having a tapered profile (i.e. a profile angle less than 90 degrees). Process used to form this feature can be a Bosch-like process, which consists of iterative alternative deposition and etching steps. An example of the deposition process is that with pressure in the range of 40~100 mTorr, TCP power in the range of 1400~2500 watts, bias voltage in the range of 100~150 volt, gas of $C_4F_8$, and ESC temperature in the range of $-10°$ C.~$+10°$ C. An example of etching process is that with pressure in the range of 40~100 mTorr, TCP power in the range of 1400~2500 watts, bias voltage in the range of 100~150 volt, gas mixture of $SF_6$/Ar, and ESC temperature in the range of $-10°$ C.~$+10°$ C. A transitional step between deposition and etching may be needed.

Furthermore, a small amount of a sulfur containing gas such as $SO_2$ or other gas such as $SiF_4$ may be added to the $C_4F_8$ gas in the passivation step of the Bosch-like process so as to modify the carbon based passivation layer on the sidewalls. Such an additive may produce C—S bonds or C—Si bonds whose characteristics are different from C—C bonds. This may reduce the time of the passivation step and/or provide further control of the sidewall profile using the iterative deposition-and-etch process.

In many cases, feature 218 may be etched relatively deep into silicon substrate 212. For example, features 220 and 222 may be etched to a depth 224 ranging from five microns to 400 microns, whereas the typical thickness of all the layers of a completed CMOS device may be only three to five microns. Deep features of this type are typically formed in silicon substrates by the use of "rapidly alternating" plasma etch processes, which utilize a fast repetition of alternating cycles of plasma etch and deposition. That is, process gasses supplied to a plasma processing reactor are rapidly toggled on and off, resulting in the process quickly changing from an "etch" condition where silicon is removed from the wafer, to a "deposition" condition where material is deposited onto the wafer and silicon is not removed, and then back again to an etch condition. The duration of the alternating cycles is typically relatively short, and a large number of cycles are typically required to achieve a desired depth 224 into the silicon substrate. However, rapidly alternating processes may have certain drawbacks, such as a relatively low etch efficiency. For example, rapidly alternating processes typically result in increased system cost and complexity due to the requirements for specialized hardware such as fast-switching, high-accuracy gas flow controllers.

A high etch efficiency and desired process flexibility may be achieved with a continuous, non-alternating etch process using a combination of supply gases comprising $SF_6$, HBr, $O_2$, and $SiF_4$. The process is continuous because, even though the supply gas flow set points may change during the process (e.g. ramped from a higher value to a lower value, or vice versa), the supply gas flows are not toggled on and off; rather, the gas supplies remain on continuously while feature 218 is etched into silicon substrate 212. The process is non-alternating because it does not change from an "etch" condition to a "deposition" condition; rather, etching of the silicon, and inhibition of etching, occur simultaneously during the etch processes. The etch efficiency of such a continuous process may be significantly improved over a rapidly alternating process because silicon is being removed during 100% of the total process time. In addition, because the gas flows are continuous, standard hardware such as gas flow controllers may be used, thus reducing the cost and complexity of the system needed to support the process.

An example of a continuous, non-alternating etch process using a combination of supply gases comprising $SF_6$, HBr, $O_2$, and $SiF_4$ is that with 2500 W of TCP power, 250V bias voltage, and a gas mixture of 235 sccm $SF_6$, 30 sccm HBr, 200 sccm $O_2$, and 190 sccm $SiF_4$ at 80 mTorr. The data clearly shows a reduction in undercut with $O_2$ and $SiF_4$, decreased bowing with $SiF_4$, and higher etch rate with HBr.

Process flexibility may be achieved by using the correct ratio of supply gases. For example, the etch rate of silicon substrate 212 may be improved by altering the ratio of $SF_6$ to the total supply gas flow. In another example, surface roughness of the silicon feature may be improved by altering the ratio of HBr to the total gas supply flow. In yet another example, a desired profile angle such as vertical (222) or tapered (220) may be achieved by altering the ratio of $SiF_4$ to the total supply gas flow. In addition, the ratio of supply gases may be optimized to produce desired process performance for a variety of wafer conditions; such as, for example, over a range feature sizes (218) ranging from 1 micron to 200 micron, or for organic-based or inorganic-based masks (202). A preferred range for $SiF_4$ is 0 to 300 sccm, more preferred is 100 to 200 sccm, and the most preferred value is 150 sccm. For HBr the preferred range is 0 to 50 sccm, more preferred is 20 to 40 sccm, and the most preferred value is 30 sccm. For $O_2$ the preferred range is 100 to 225 sccm, more preferred is 150 to 225 sccm, and the most preferred is 190 to 205 sccm. The preferred range for $SF_6$ is 200 to 300 sccm.

In addition, process performance and flexibility of the continuous etch process may be enhanced by changing typical process parameters such as plasma power, wafer bias power, process chamber pressure, or the like, during the continuous etch process. For example, the plasma power supply, and/or the wafer bias voltage may be pulsed in an on/off or high/low fashion in order to balance the ratio of neutral to charged reactive plasma components reaching the wafer. In another example, the plasma power, the wafer bias power, and/or the pressure in the plasma processing chamber may be ramped from a high value to a low value, or vice versa, during the continuous etch process.

After feature 218 has been etched into silicon substrate 212 (FIG. 1 step 140), wafer 200 may be subjected to an optional post-treatment process (FIG. 1 step 150). For example, if the mask 202 used to define feature 218 is organic-based, such as a photoresist, a mask removal post treatment process comprising an oxygen-containing plasma may be performed. An example of such a mask-removal process is one conducted in a down stream plasma reactor with a flow of 2500 to 10,000 sccm of $O_2$, 250 to 3000 sccm of $N_2$, 0 to 1000 sccm of $H_2O$, with a down stream discharge, generated by microwaves or inductive RF, applied power of 2 to 8 kW, at a pressure of 600 to 2000 mTorr, where the wafer temperature is 150 to 300 degrees Celsius.

In another example, if a corrosion-prone layer such as metal-containing layer is present (e.g. layers 204, 206, 208, or 210 in FIGS. 2A-C), a corrosion-passivation post-treatment process comprising water vapor may be performed. An example of a corrosion-passivation process is conducted in a down stream plasma reactor with a flow of 500 to 3000 sccm of $H_2O$, and a flow of 0 to 3000 He, with a down stream discharge, generated by microwaves or inductive RF, applied power of 2 to 8 kW, at a pressure of 600 to 3000 mTorr, where the wafer temperature is 150 to 300 degrees Celsius.

However, if photoresist and/or corrosion-prone layers are not present, or if it may be advantageous for some other reason, the wafer post-treatment step (FIG. 1 step 150) may be omitted and the wafer may be unloaded from the processing chamber (FIG. 1 step 160) after the feature has been formed in the silicon substrate (FIG. 1 step 140).

Figure 3:
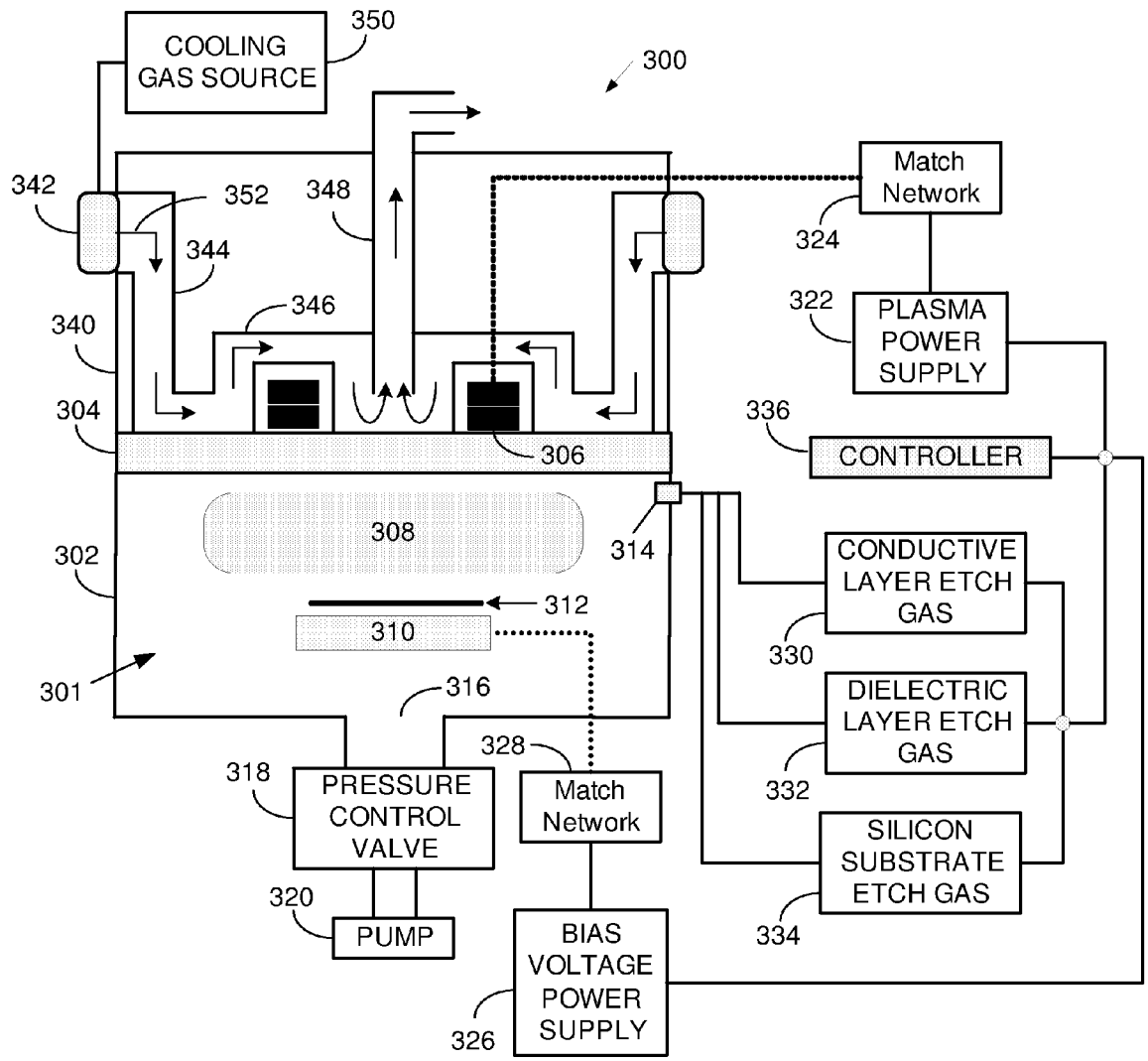
FIG. 3 is a schematic view of one embodiment of a plasma processing system which may be used to carry out an embodiment of the invention.

The embodiment of the invention exemplified by the processes flowchart in FIG. 1 may be performed in a plasma processing chamber such as that shown in FIG. 3, which is a schematic view of a plasma processing system 300 including a plasma reactor 302 having a plasma processing chamber 301 therein. A plasma power supply 322, tuned by a match network 324 supplies power to an antenna 306 located near a window 304 to create a plasma 308 in plasma processing chamber 301. Antenna 306 may be configured to produce a uniform diffusion profile within processing chamber 301; for example, antenna 306 may be configured for a toroidal power distribution in plasma 308. Window 304 is provided to separate antenna 306 from plasma chamber 301 while allowing energy to pass from antenna 306 to plasma chamber 301. A wafer bias voltage power supply 326 tuned by a match network 328 provides power to an electrode 310 to set the bias voltage on wafer 312, which is supported by electrode 310, which provides a substrate support, which supports the wafer from before the pre-treatment processing until after the post-treatment processing. Set points for plasma power supply 322 and wafer bias voltage supply 326 are set by controller 336.

Plasma power supply 322 and wafer bias voltage power supply 326 may be configured to operate at specific radio frequencies such as, for example, 13.56 MHz, 27 MHz, 2 MHz, 400 kHz, or combinations thereof. Plasma power supply 322 and wafer bias power supply 326 may be appropriately sized to supply a range of powers in order to achieve desired process performance. For example, in one embodiment plasma power supply 322 may supply over 5000 Watts of power, and wafer bias voltage power supply 326 may supply of power over 1250 Watts of power. In addition, antenna 306 and/or electrode 310 may be comprised of two or more sub-antennas or sub-electrodes, which may be powered by a single power supply or powered by multiple power supplies.

A gas supply mechanism or gas source comprising a conductive layer etch gas source 330, a dielectric layer etch gas source 332, and a silicon substrate etch gas source 334 supply the proper chemistry required for the processes to the interior of plasma chamber 301. Conductive layer etch gas source 330 may, include, for example, typical metal-containing conductive layer etch gases such as $Cl_2$, $BCl_3$, $H_2O$, HBr, $SF_6$, $NF_3$, $CHF_3$, Ar, He, $O_2$, $H_2O$, or the like. Dielectric layer etch gas source 332 may include, for example, typical dielectric layer etch gases such as $CH_2F_2$, $CH_3F$, $CHF_3$, $C_4F_8$, $C_4F_6$, $H_2$, $O_2$, $N_2$, Ar, $CO_2$, CO, or the like. Silicon substrate etch gas source 334 may include, for example, $SF_6$, HBr, $O_2$, SiF4 and $SiCl_4$ Examples of the possible combinations of these gases are: $SF_6$ alone; $SF_6$ and $O_2$; $SF_6$, $O_2$ and $SiF_4$; $SF_6$, $O_2$ and $SiCl_4$; $SF_6$, $O_2$ and HBr; $SF_6$, $O_2$, $SiF_4$ and HBr; $SF_6$, $O_2$ and $SiCl_4$; $SF_6$, $O_2$, $SiCl_4$ and HBr; in addition to typical silicon-containing layer etch gases such as $Cl_2$, $SiF_4$, $NF_3$, $C_2H_4$, He, Ar, $H_2$, $C_2H_4$, $CO_2$, CO, or the like.

In addition, $O_2$ in the silicon substrate etch gas, which is an oxidation gas to protect the sidewalls, may be partially or fully replaced by $SO_2$, $CO_2$, CO, $NO_2$, $N_2O$, or a combination thereof. $SO_2$, $CO_2$, CO, $NO_2$, $N_2O$, or a combination thereof may be added to $O_2$. Changing the oxidation gas components may result in changing the characteristics of the sidewall passivation during the steady-state etching. The composition of the passivation layer would be changed from primarily an $SiO_2$ layer (with $O_2$ only), to a SiN or SiON if $N_2O$, $NO_2$, $NH_3$, and/or $N_2$ are added, or to a SiC or SiOC if $CO_2$ and/or CO are used. Furthermore, sidewall passivation during silicon etching may also be modified by adding other compounds, such as B containing compound, for example, $BCO_3$, $B_2H_6$, $BCl_3$, and the like, to oxygen or oxygen containing gas. This results in a sidewall passivation that is mostly SiOBN or SiBN. Modifying the structure of the passivation layer can have several effects on the properties and performance of the passivation layer thus affecting the etch characteristics and resulting profile of the features.

An example of the deposition process is that with pressure in the range of 40~100 mTorr, TCP power in the range of 1400~2500 watts, bias voltage in the range of 100~150 volt, gas of $C_4F_8$, and ESC temperature in the range of −10° C.~+10° C. An example of etching process is that with pressure in the range of 40~100 mTorr, TCP power in the range of 1400~2500 watts, bias voltage in the range of 100~150 volt, gas mixture of $SF_6$/Ar, and ESC temperature in the range of −10° C.~+10° C. A transitional step between deposition and etching may be needed.

Gas sources 330, 332, and 334 are in fluid connection with processing chamber 301 through inlet 314. Gas inlet 314 may be located in any advantageous location in chamber 301, and may take any form for injecting gas, such as a single nozzle or a showerhead. Most preferably, however, gas inlet 314 may be configured to produce a "tunable" gas injection profile; that is, to allow independent adjustment of the gas flow to multiple zones in the process chamber. Process gases and byproducts are removed from chamber 301 via a pressure control valve 318 and a pump 320, which also serve to maintain a particular pressure within plasma processing chamber 301. Set points for conductive layer etch gas source 330, dielectric layer etch gas source 332, and silicon substrate etch gas source 334 are set by controller 336.

Figure 6:
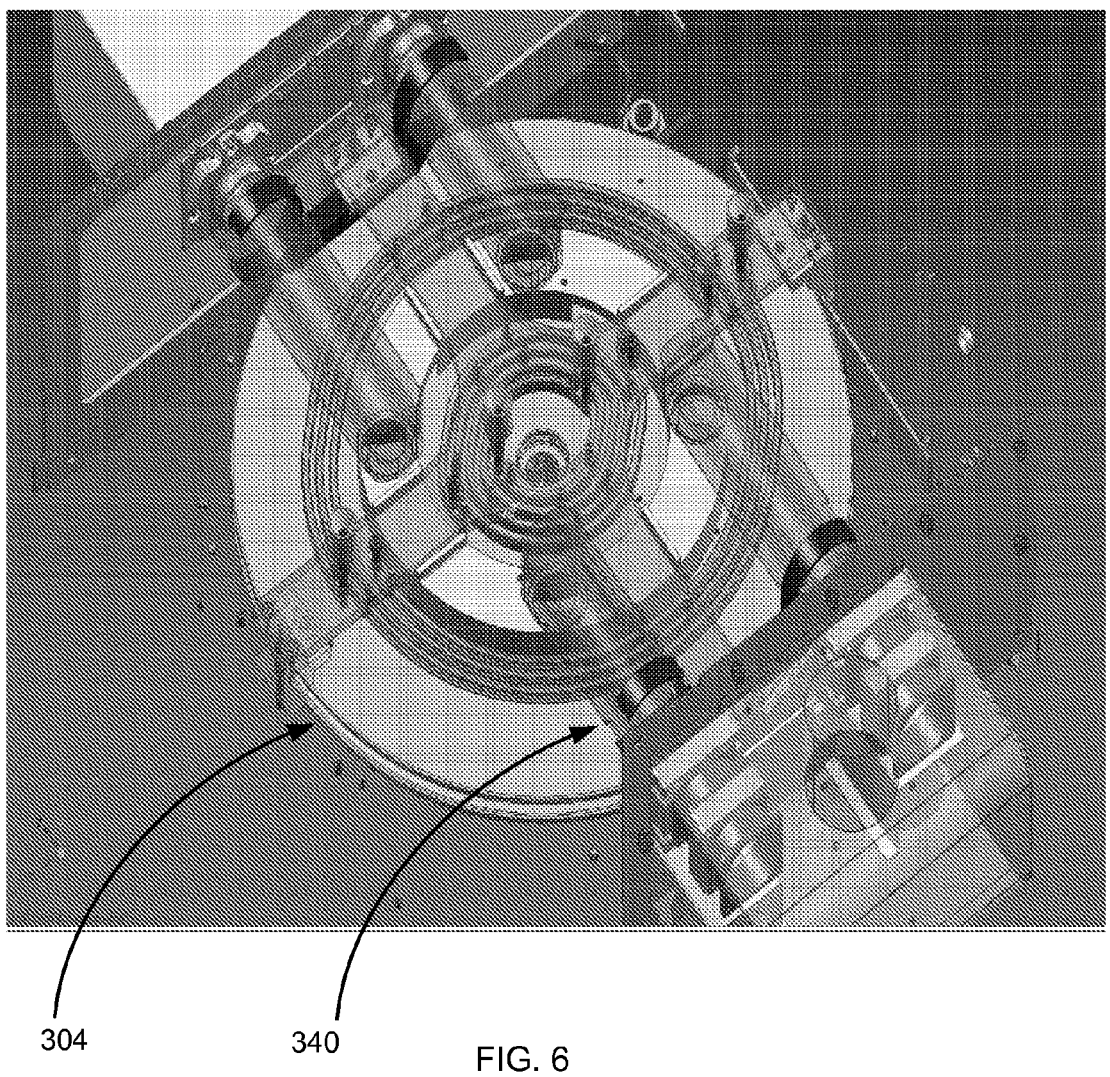
FIG. 6 is a perspective view of a top of a window with a cooling system.
Figure 7:
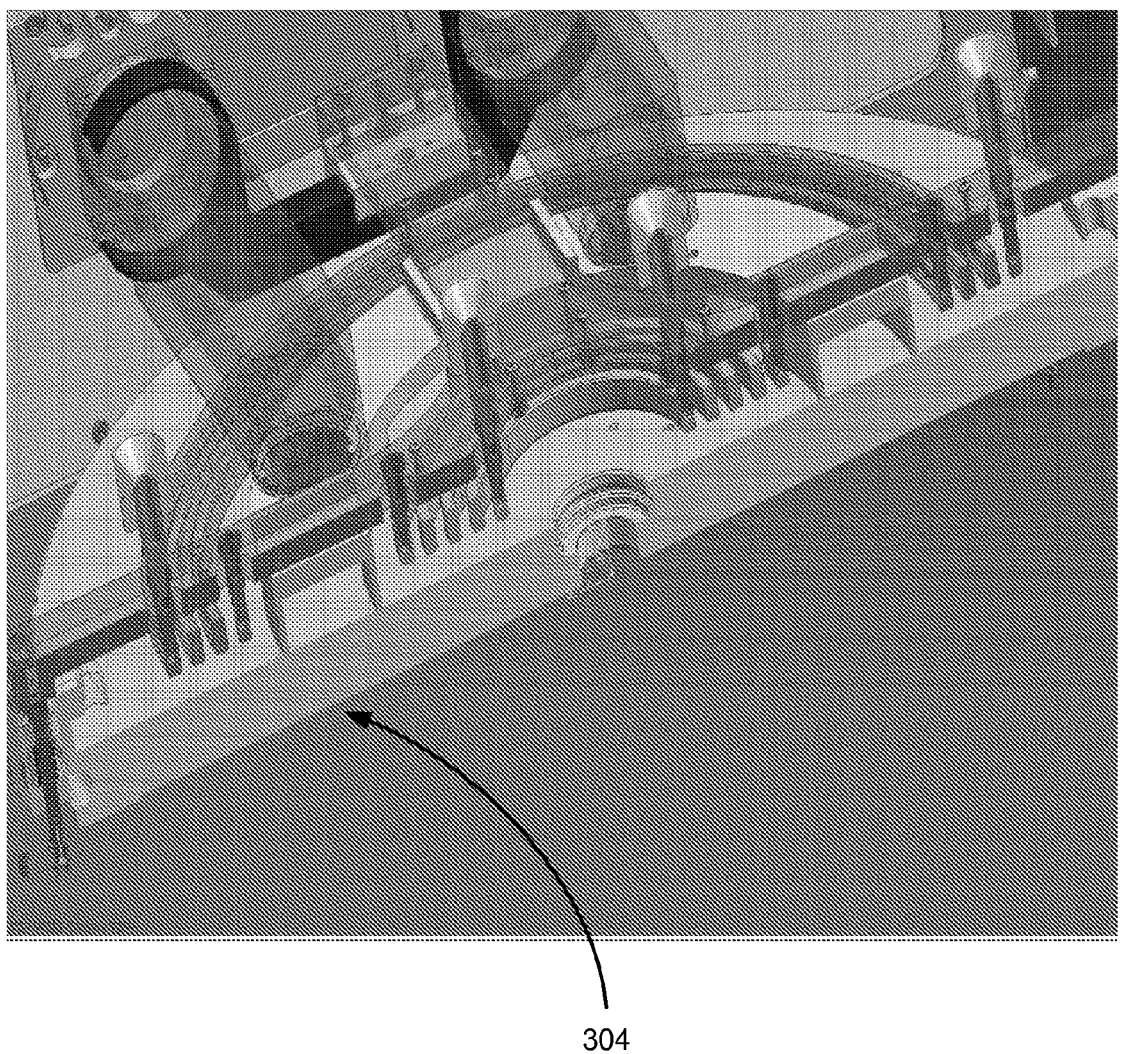
FIG. 7 is a cross-sectional view of the window of FIG. 6.

During normal operation, especially at higher plasma power set points, the temperature gradient across the window 304 causes stresses within the window to increase which may be large enough to cause mechanical failure of the window. For example, the center of the window may be hotter than the edge which causes high hoop stress at the edge of the window. In addition, the overall temperature of the window may increase to the point that parts of etch chamber may degrade and reduce system performance. For example, at high temperatures o-ring vacuum seals may begin to deteriorate and lead to problems such as particle generation or compromised vacuum integrity. A window cooling system 340 is therefore employed on plasma processing system 300 to reduce the temperature gradient across the window and to reduce the overall operating temperature of window 304. A pump 342 may be used to move cooling gas 352 from a cooling gas source 350 which is at a temperature lower than the temperature of window 304. In one embodiment, cooling gas source 350 may be ambient atmosphere, and pump 342 may be a fan. In another embodiment, cooling gas source 350 may be a pressurized gas source, such as clean dry air (CDA), nitrogen, or the like, and pump 342 may be used to pressurize cooling gas source 350. Cooling gas 352 is directed into an input conduit 344 to an enclosure 346 where cooling gas 352 is used to transfer heat out of, or away from, window 304, before being directed out of window cooling system 340 via an output conduit 348. The overall temperature of the window 304 may thus be reduced by varying the flow rate of cooling gas 352 through window cooling system 340. The input and output conduits, as well as the enclosure, may be designed to expose as much or as little of window 304 as is required to minimize the temperature gradient across the window. FIG. 6 is a perspective view of a top of a window 304 with the cooling system 340. FIG. 7 is a cross-sectional view of the window 304 of FIG. 6. Air could be directed from the outside ambient along tubes to a round enclosure in the middle of the window, where the window may be hottest. Air exits the round enclosure directed towards the center of the window and allowed to exit the window enclosure through holes in the enclosure. This will reduce the temperature where it is hottest, minimizing the temperature gradient and stresses, while reducing the overall window temperature.

Figure 4A:
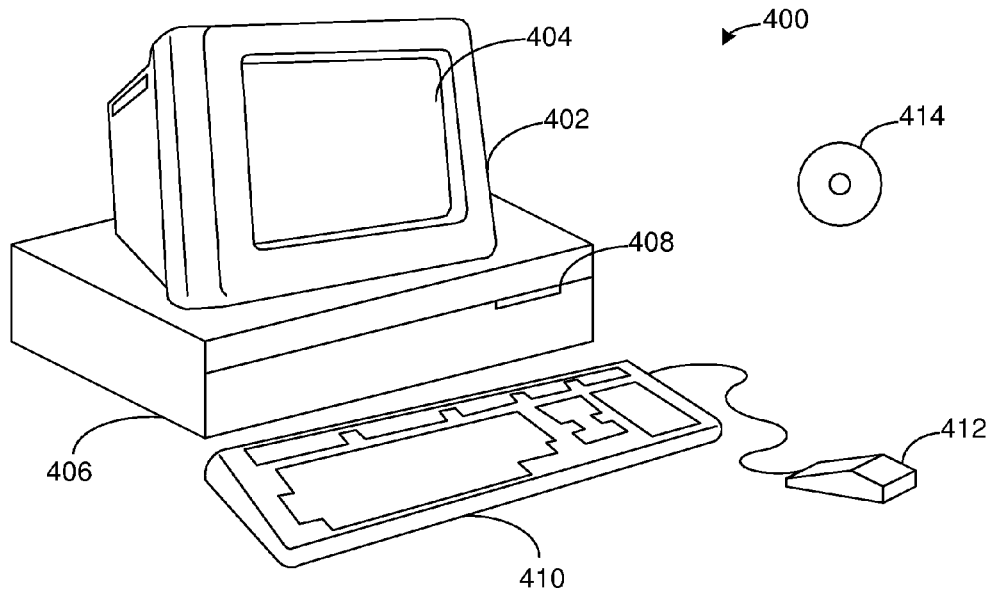
FIG. 4A-B illustrate a computer system, which is suitable for implementing a controller used in embodiments of the invention.
Figure 4B:
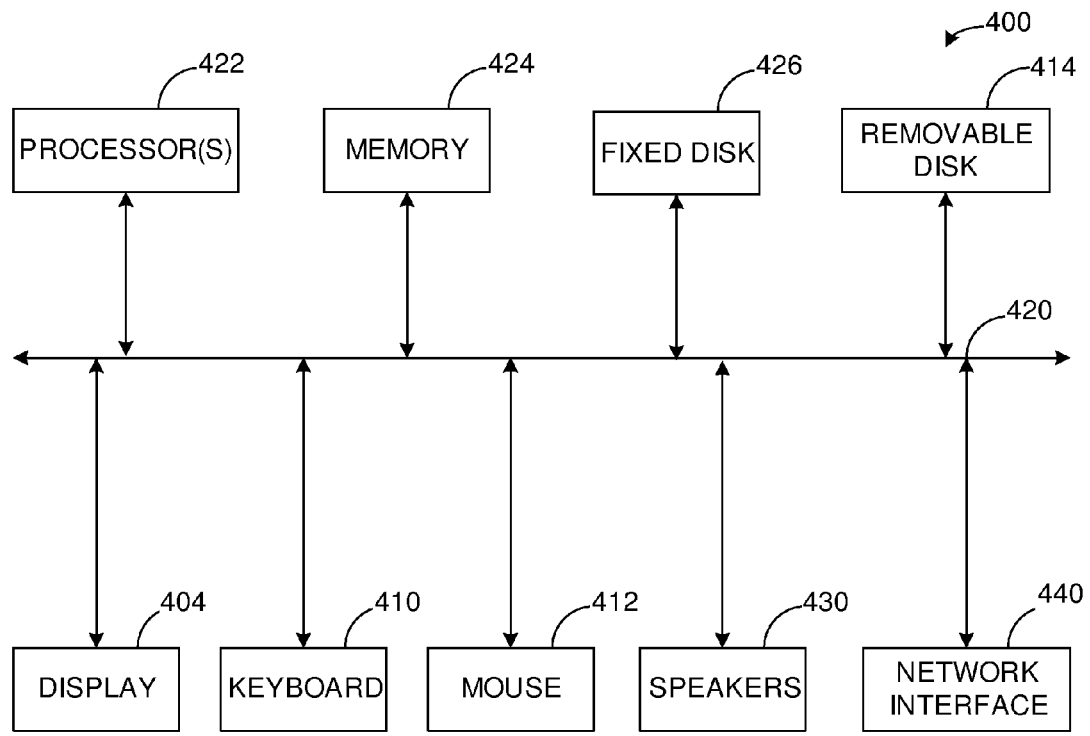

FIGS. 4A and 4B illustrate a computer system, which is suitable for implementing a controller (such as 336 in FIG. 3) which may be used in one or more embodiments of the present invention. FIG. 4A shows one possible physical form of a computer system 400. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units, or CPU's are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 is also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magnetooptical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

An example of how the present invention may be used is the formation of features such as through-silicon vias which may be used in three-dimensional integrated circuit ("3DIC") devices. Through-silicon vias are features etched into the silicon substrate which may range in depth from, for example, 5 microns to 400 microns and in critical dimension from, for example, 1 micron to 100 microns. Through-silicon vias may be formed at any time during a CMOS device fabrication scheme, and may be relatively large in comparison to typical CMOS devices which, for example, may be only three to five microns thick. The uses of through-silicon vias include the ability to more-directly connect CMOS circuitry on different levels of a 3DIC device than would otherwise be possible. The benefits of incorporating through-silicon vias into a 3DIC device integration scheme may include a smaller form factor and a higher packing density for the final device, as well as performance improvements such as a higher device speed and a lower power consumption.

Figure 5:
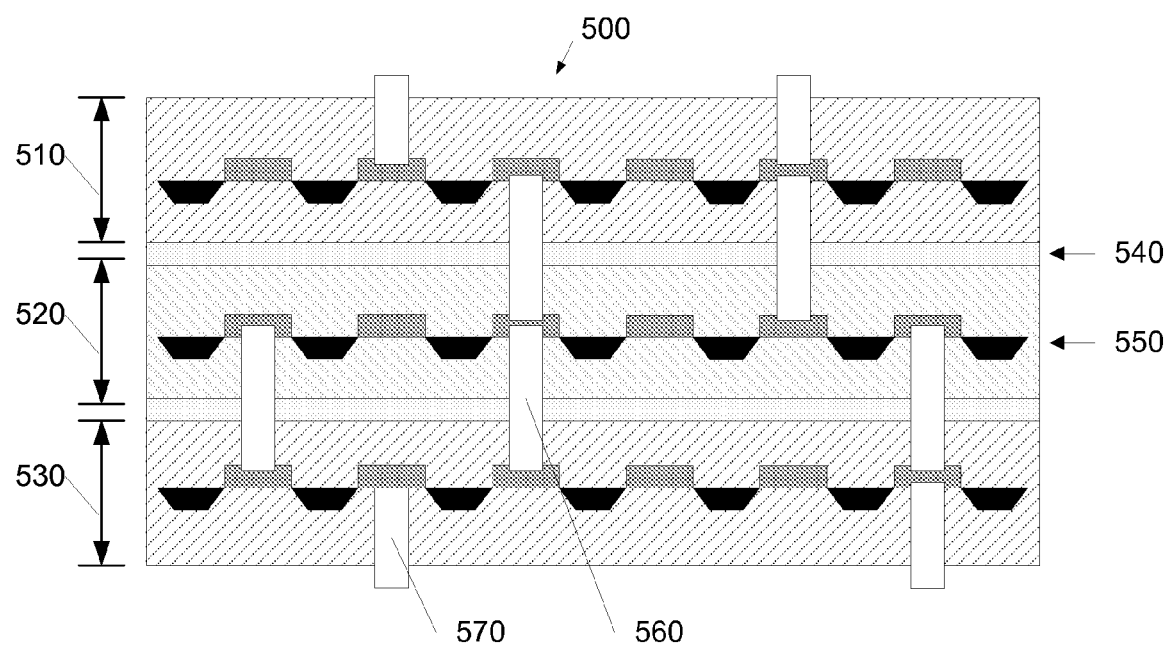
FIG. 5 is a schematic of an example stacked three-dimensional integrated circuit device illustrating the advantages of one embodiment of the invention.

An example of a 3DIC device incorporating through-silicon vias is shown in FIG. 5. A single 3D stacked layer device 500 is comprised of individual silicon wafers 510, 520, and 530 which have been physically bonded together 540. Each individual silicon wafer contains a layer of fully-fabricated and functional 2D CMOS devices 550, which are directly connected to each other through metal-filled through-silicon vias 560. That is, through-silicon vias 560 may allow a direct connection between the circuitry of one layer (e.g. 520) to the circuitry in the layer above (e.g. 510) and/or to the circuitry in the layer below (e.g. 530). Through-silicon vias 570 may also be used to connect the three-dimensional integrated circuit device 500 to external electronic circuits (not shown).

The incorporation of through-silicon vias into a device integration scheme may result in additional processing cost and complexity. For example, completed CMOS devices typically incorporate dedicated features such as pads to allow electrical testing to be performed on the finished device. Multiple conductive and/or dielectric device layers are typically present in the pad region (as previously illustrated by way of example in FIG. 2A). If the pad region is to be used for the formation of through-silicon vias, all underlying conductive and dielectric layers must first be removed before a through-silicon via may be formed in the silicon substrate (e.g. as illustrated by FIG. 2B). Typically, each type of layer must be removed in a dedicated processing chamber. For example, metal-containing layers may be removed in metal etch chambers, silicon-containing layers may be removed in a silicon etch chamber, and dielectric layers may be removed in dielectric etch chamber.

Alternatively, device integration schemes may reserve dedicated areas for through-silicon vias which are substantially free of electrical device layers, and thus avoid the cost and complexity associated with removing existing device layers. However, such reserved areas are typically located remotely from desired device connection points such as pads. Therefore, additional processing cost and complexity may arise in the form of multiple patterning, etch, metallization, CMP, and cleaning steps which may be required to connect the remote through-silicon via to the CMOS pad.

In accordance with one embodiment of the invention, the additional processing steps associated with removing existing conductive and/or dielectric layers may be minimized because the layers may be removed in a single chamber, rather than multiple, dedicated chambers. In addition, the process steps associated with the formation of electrical connections to remote through-silicon vias may be avoided by using the invention to remove conductive and dielectric device layers, and to form through-silicon vias, in the pad areas. Therefore, it may be advantageous to use the invention for the formation of features such as through-silicon vias used for three-dimensional integrated circuit devices.

Figure 8:
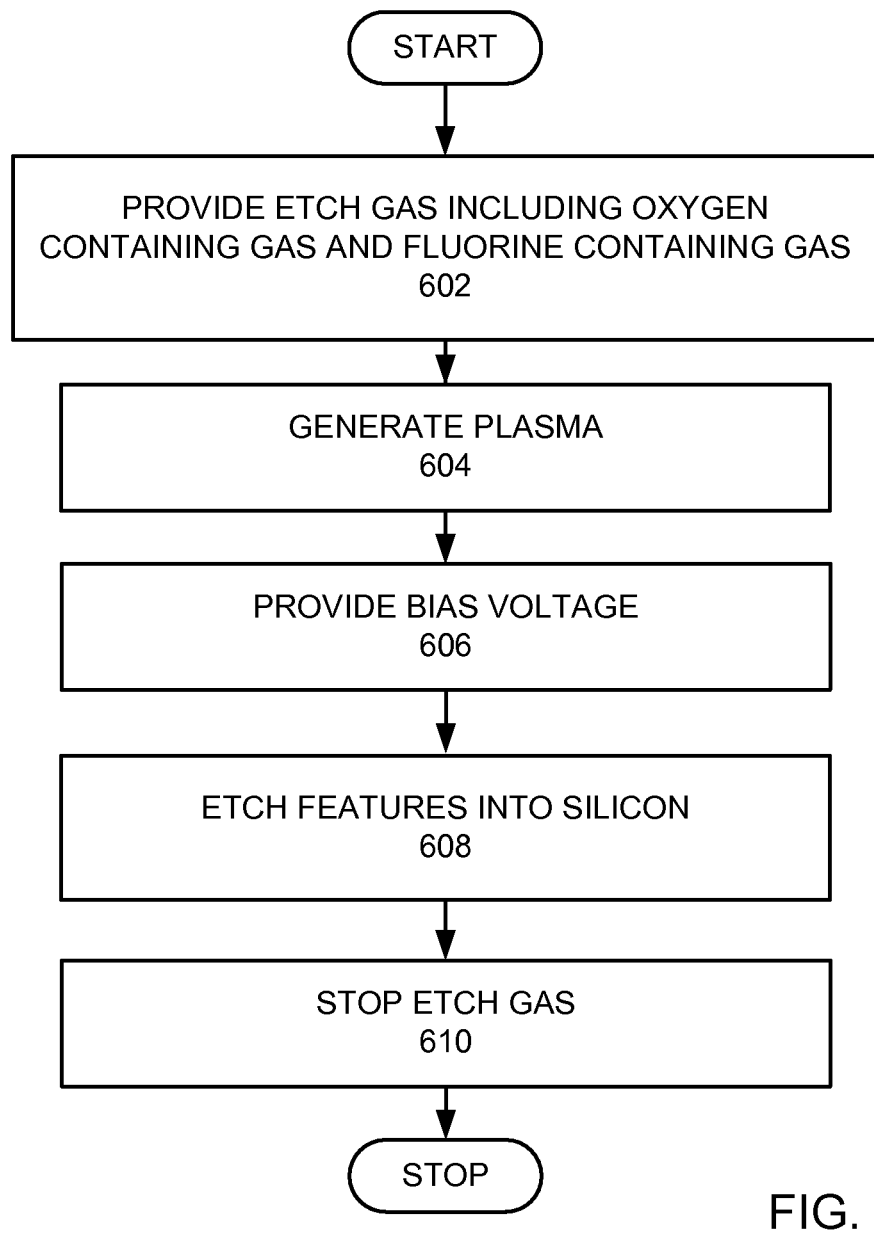
FIG. 8 is a flow chart of a method of etching features into a silicon layer with a steady-state gas flow in accordance with one embodiment of the present invention.

FIG. 8 schematically illustrates a method of etching features into a silicon layer with a steady-state gas flow, in accordance with one embodiment of the present invention. This process is a deep silicon etch and may be performed as part of a multiple-type multi-layer process (such as step 140 in FIG. 1) using the plasma processing system 300 described above, or a stand alone silicon etch process. The deep silicon etch may be used, for example, to form through-silicon vias before or after forming CMOS devices before the back end of lines ("via-first" process), or after forming the back end of lines before or after bonding ("via-last" process). In the previous embodiment described above, features are etched into a silicon substrate using an etch gas containing $SF_6$, $O_2$, $SiF_4$, and HBr in a non-switching continuous manner (steady-state), where $SF_6$ is a main etchant and $O_2$ is added to protect sidewalls by reacting with silicon to form a durable $SiO_2$ layer (sidewall passivation). In this embodiment, $O_2$ is partially or totally replaced by other oxygen containing gas (such as $SO_2$) so as to enhance the characteristics of oxidation and control the profile of the sidewalls. Similarly to the previous embodiment, a fluorine containing gas (such as $SF_6$) is a main etchant and the oxygen containing gas is used as a passivation oxidizer. FIG. 9 is a schematic cross-sectional view of the deep silicon etch through a mask in accordance with one embodiment of the present invention. The mask 902 may be a photoresist (PR) mask and/or a hard mask. As shown in FIG. 9, fluorine species come through the silicon layer and etch features in the vertical direction, while the sidewalls 904 are protected by the silicon oxide (SiOx) layer 906. The etch verticality is enhanced by the bias voltage. $SiF_4$ may be added to reduce the undercut under the mask.

Figure 10:
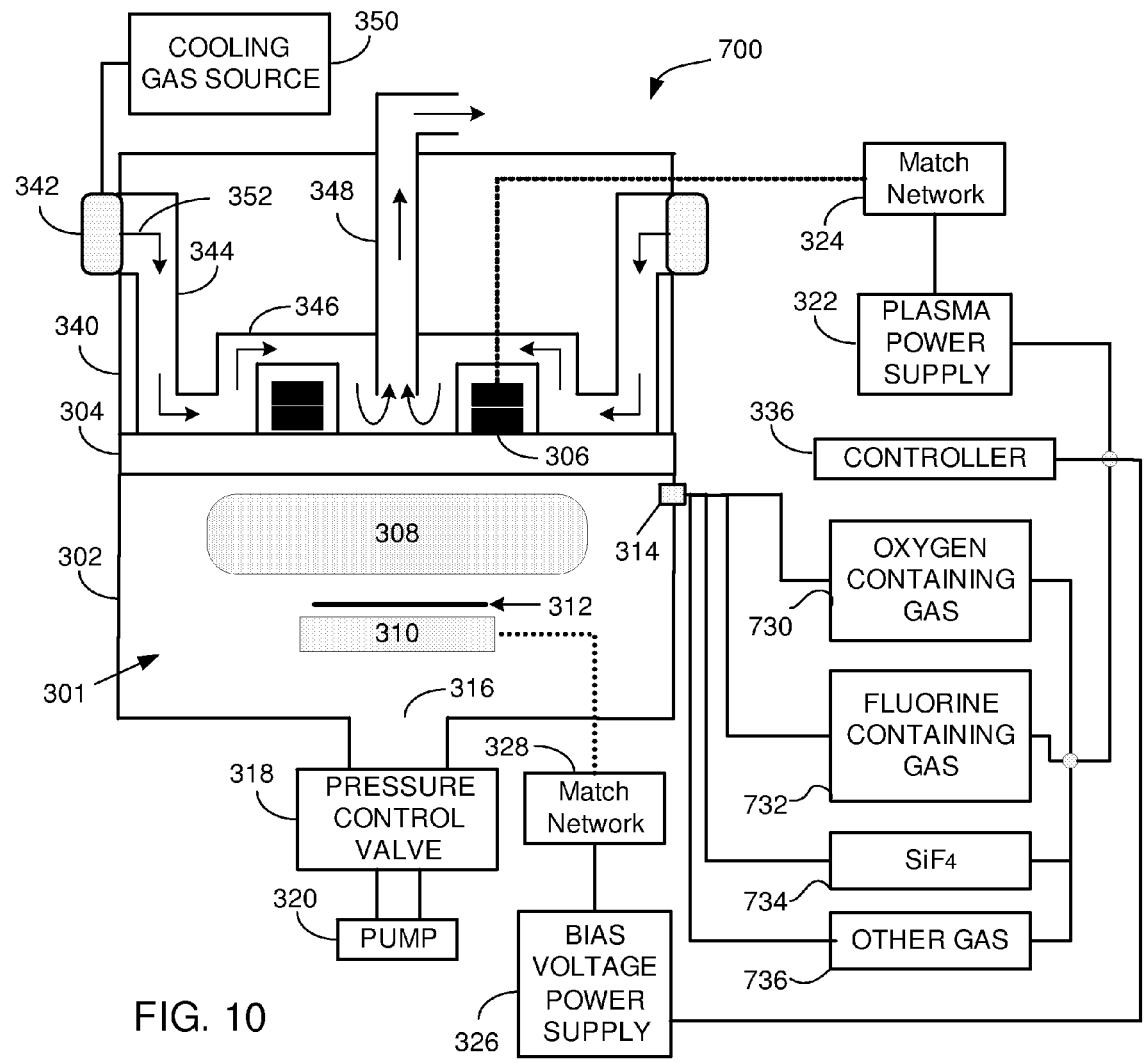
FIG. 10 is a schematic view of an example of a plasma processing system which may be used to carry out an embodiment of the invention.

FIG. 10 is a schematic view of a plasma processing system 700 that may also be used for the inventive deep silicon etch in this embodiment. The plasma processing system 700 is similar to the plasma processing system 300, and the like elements bear like reference numerals, such that those of ordinary skill in the art would understand the like elements without further explanation. As shown in FIG. 10, the plasma processing system 700 comprises a gas source including an oxygen containing gas source 730, a fluorine containing gas source 732, a $SiF_4$ gas source 734, and other gas source(s) 736, controlled by the controller 336. The controller can be implemented as shown in FIGS. 4A and 4B, as described above.

Referring back to FIG. 8, an etch gas comprising an oxygen containing gas (for example, $SO_2$) and a fluorine containing gas is provided into an etch chamber where the silicon layer is placed (602). The silicon layer may be a silicon substrate (typically crystalline silicon) or other silicon layer. A plasma is generated from the etch gas (604). A bias voltage is provided (606) and features are etched into the silicon layer using the plasma (608). Then, the flow of the etch gas to the plasma chamber is stopped (610).

The bias voltage is equal to or greater than 5 volt. Preferably, the bias voltage is between 5 to 500 volt. The bias voltage may be a couple of hundreds volts. The oxygen containing gas works as a passivation gas, and includes at least one of $SO_2$, $CO_2$, CO, $NO_2$, or $N_2O$. Preferably, the oxygen containing gas includes $SO_2$. The oxygen containing gas may further comprise $O_2$. The fluorine containing gas contains $SF_6$ or $NF_3$, preferably $SF_6$, as an etching agent. The etch gas may further contain $SiF_4$, HBr, $C_4F_8$ and/or other fluorocarbons as additives. In addition, the etch gas further comprises a boron (B) containing gas such as $BCO_3$, $B_2H_6$, $BCl_3$, and the like, as a passivation gas in addition to the oxygen containing gas.

An example of the silicon etch recipe may include the etching gas containing about 300 sccm $SF_6$, about 0 to 150 sccm $O_2$, about 0 to 200 sccm $SO_2$ (preferably 30 to 150 sccm $SO_2$), and about 150 sccm $SiF_4$, under about 100 mTorr of pressure, with about 2500 Watts of the plasma power supply, and about 250 volt of wafer bias voltage. Adding $SO_2$ or replacing $O_2$ with $SO_2$ unexpectedly reduced undercut and sidewall roughness, and provided more taper in the via profile. For example, about 40% to 50% of $O_2$ in the original etching gas recipe may be replaced with $SO_2$ so as to reduce undercut under the mask. If other conditions are the same, increased amount/ratio of $SO_2$ with respect to $O_2$ provides more tapered profile. The bias voltage and/or total flow rate also affect the taper. Thus, by controlling those parameters, the taper of the features can be controlled so as to satisfy a given specification of the features.

It was found that adding $SiF_4$ to $SF_6/SO_2/O_2$ chemistry unexpectedly decreases bowing, reduces undercut, and widens the bottom CD in highly tapered vias. For example, a highly tapered via (with the top CD of about 35 μm and the bottom CD of about 8 μm) was obtained using the etch gas containing about 300 sccm $SF_6$, about 120 sccm $O_2$, about 30 sccm $SO_2$, and 0 sccm $SiF_4$, under about 100 mTorr of pressure, with about 2500 Watts of the plasma power supply, and about 250 volt of wafer bias voltage, while a less tapered profile with a lager bottom CD (with the top CD of about 34 μm and the bottom CD of about 24 μm) was obtained using the etching gas containing about 300 sccm $SF_6$, about 120 sccm $O_2$, about 30 to 15 sccm $SO_2$ (ramping down), and 150 sccm $SiF_4$ under about 100 mTorr of pressure, with about 2500 Watts of the plasma power supply, and about 250 volt of wafer bias voltage. As the etching progresses deep into the holes (vias), the etching reaction changes. Thus, in order to obtain desired profile, the ratio of $SO_2$ or other passivation gas component can be ramped up or down, and the bias voltage, power, and/or pressure can also be ramped up or down for better control of the profile as the progression of the etching.

In accordance with one embodiment of the present invention, the oxidation/passivation gas components are changed from pure $O_2$ gas to $SO_2$, $CO_2$, CO, $NO_2$, $N_2O$, or a combination thereof, or combination of one or more of these gases and $O_2$. Different oxidation gas components change the characteristics of the protective sidewall (passivation layer) during the steady-state etching. When $SO_2$ is used, the passivation layer may include SiOx while the primary composition is $SiO_2$, if only $O_2$ is used. The composition of the passivation layer would be SiN or SiON, if $N_2O$, $NO_2$, $NH_3$, and/or $N_2$ are used as the passivation gas. The composition of the passivation layer would be SiC or SiOC if $CO_2$ and/or CO are used. Furthermore, sidewall passivation during silicon etching may also be modified by adding other compounds, such as B containing compounds, to oxygen or oxygen containing gas. This results in a sidewall passivation that is mostly SiOBN or SiBN. Modifying the structure of the passivation layer can have several effects on the properties and performance of the passivation layer thus affecting the etch characteristics and resulting profile of the features.

In addition, a small amount of a sulfur containing gas such as $SO_2$ or other gas such as $SiF_4$ may be added to the $C_4F_8$ gas in the passivation step of the Bosch-like process so as to modify the characteristics of the carbon based passivation layer on the sidewalls. Such an additive may produce C—S bonds or C—Si bonds whose characteristics are different from C—C bonds. This may reduce the time of the passivation step and/or provide further control of the sidewall profile using the iterative deposition-and-etch process.

The present invention is suitable for deep silicon etching, specially with high aspect ratio. For example, an aspect ratio of the features may be least 80, or alternatively, the depth of the features may be at least 80 μm.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of etching features into at least one conductive layer, at least one dielectric layer, and into a silicon substrate through a patterned mask, comprising:
   a) loading a wafer into a process chamber, wherein the patterned mask, the at least one conductive layer and the at least one dielectric layer are disposed over the silicon substrate;
   b) etching at least one conductive layer through the patterned mask, comprising
      flowing a conductive layer etch gas into the process chamber;
      forming a plasma from the conductive layer etch gas;
      etching the at least one conductive layer with the plasma formed from the conductive layer etch gas such that the at least one conductive layer is patterned to have the features therein; and
      stopping the conductive layer etch gas flow;
   c) etching at least one dielectric layer through the patterned mask, comprising:
      flowing a dielectric layer etch gas into the process chamber;
      forming a plasma from the dielectric layer etch gas;
      etching the at least one dielectric layer with the plasma formed from the dielectric layer etch gas such that the at least one dielectric layer is patterned to have the features therein; and
      stopping the dielectric layer etch gas flow;
   d) etching the silicon substrate through the patterned mask, the at least one patterned conductive layer, and the at least one patterned dielectric layer, comprising:
      flowing a silicon etch gas into the chamber;
      forming a plasma from the silicon etch gas;
      etching into the silicon substrate with the plasma formed from the silicon etch gas; and
      stopping the silicon etch gas flow; and
   e) unloading the wafer from the process chamber,
   wherein a temperature of a chuck supporting the silicon substrate is maintained in a range between −10° C. and +10° C. during the etching of the at least one conductive layer and the etching of the silicon substrate.

2. The method of claim 1, wherein the at least one conductive layer is a metal-containing layer.

3. The method of claim 1, wherein the at least one dielectric layer is a silicon-containing layer.

4. The method of claim 1, further comprising providing a pre-etch treatment in the same chamber, after loading the wafer into the process chamber and prior to the etching, comprising:
providing a pre-etch treatment gas;
forming a plasma from the pre-etch treatment gas; and
treating the wafer surface with the plasma formed from the pre-etch treatment gas.

5. The method of claim 4, wherein the plasma from the pre-etch treatment gas removes defects present in the surface of the exposed layer.

6. The method of claim 1, wherein a plurality of conductive layers and a plurality of dielectric layers are alternately disposed over the silicon substrate, and steps b and c are repeated in an alternating manner at least twice.

7. The method of claim 1, further comprising providing a post-etch treatment in the same chamber, after etching of the silicon substrate and before unloading the wafer, comprising:
providing a post-etch treatment gas into the chamber;
forming a plasma from the post-etch treatment gas; and
treating the wafer surface with the plasma formed from the post-etch treatment gas.

8. The method of claim 7, wherein the plasma from the post-etch treatment gas removes the patterned mask remaining on the wafer without removing the at least one patterned conductive layer and the at least one patterned dielectric layer.

9. The method of claim 7, wherein the plasma from the post-etch treatment gas removes the patterned mask remaining after completing said etching the silicon substrate, and wherein the wafer remains in the process chamber after the loading, during performing steps b), c), and the post-etch treatment, until the unloading.

10. The method of claim 1, wherein the temperature of the chuck supporting the silicon substrate is maintained in a range between −10° C. and +10° C. during the etching of the at least one dielectric layer.

11. The method of claim 1, wherein the temperature of the chuck supporting the silicon substrate is maintained in a range between −10° C. and +10° C. during the etching of the at least one dielectric layer if the dielectric layer is a silicon oxide dielectric layer, and a range between −10° C. and +60° C. if the dielectric layer is a low-k dielectric layer.

12. The method of claim 1, wherein the silicon substrate is etched with a steady-state gas flow comprising $SF_6$, $O_2$, $SiF_4$, and HBr.

13. The method of claim 1, wherein the at least one conductive layer includes a metal-containing conductive layer and a silicon containing conductive layer.

14. A method of etching features into at least two conductive layers, at least two dielectric layers, and into a silicon substrate through a patterned mask, comprising:
a) loading a wafer into a process chamber, wherein, the at least two conductive layers and the at least two dielectric layers are alternately disposed over the silicon substrate;
b) etching a conductive layer through the patterned mask, comprising
flowing a conductive layer etch gas into the process chamber;
forming a plasma from the conductive layer etch gas;
etching the conductive layer with the plasma formed from the conductive layer etch gas such that the conductive layer is patterned to have the features therein; and
stopping the conductive layer etch gas flow;
c) etching a dielectric layer through the patterned mask, comprising:
flowing a dielectric layer etch gas into the process chamber;
forming a plasma from the dielectric layer etch gas;
etching the dielectric layer with the plasma formed from the dielectric layer etch gas such that the dielectric layer is patterned to have the features therein; and
stopping the dielectric layer etch gas flow;
d) repeating steps b) and c) in an alternating manner at least twice;
e) etching the silicon substrate, after completing step d), through the patterned mask, patterned conductive layers, and patterned dielectric layers, comprising:
flowing a silicon etch gas into the chamber;
forming a plasma from the silicon etch gas;
etching into the silicon substrate with the plasma formed from the silicon etch gas; and
stopping the silicon etch gas flow; and
f) unloading the wafer from the process chamber,
wherein a temperature of a chuck supporting the silicon substrate is maintained in a range between −10° C. and +10° C. during at the etching of the conductive layer and the etching of the silicon substrate.

15. The method of claim 14, wherein the at least one conductive layer includes a surface conductive layer below the patterned mask and a conductive device layer below a dielectric layer.

16. The method of claim 15, wherein the at least one dielectric layer includes the dielectric layer below the surface conductive layer and a dielectric device layer below the conductive device layer.

17. The method as recited in claim 14, wherein said etching the silicon substrate further comprises:
providing a bias voltage.

18. The method as recited in claim 14, wherein in said etching the silicon substrate, an aspect ratio of the features is at least 80.

19. The method as recited in claim 14, wherein in said etching the silicon substrate, a depth of the features is at least 80 μm.

20. The method as recited in claim 14, wherein the silicon etch gas comprises an oxygen containing gas and a fluorine containing gas.

21. The method as recited in claim 20, wherein the oxygen containing gas comprises at least one of $O_2$, $SO_2$, $CO_2$, CO, $NO_2$, or $N_2O$.

22. The method as recited in claim 20, wherein the fluorine containing gas contains $SF_6$ or $NF_3$.

23. The method as recited in claim 20, wherein the silicon etch gas further contains at least one of $SiF_4$, HBr, $C_4F_8$, or other fluorocarbons.

24. The method as recited in claim 20, wherein the oxygen containing gas comprises $SO_2$ and $O_2$, the method further comprising:
controlling at least one of a total flow or a ratio of $SO_2$ to $O_2$ so as to control taper of the features.

25. The method as recited in claim 24, further comprising:
ramping down a flow of $SO_2$ during said etching.

26. The method of claim 14, wherein the temperature of the chuck supporting the silicon substrate is maintained in a range between −10° C. and +10° C. during the etching of the dielectric layer.

27. The method of claim 14, wherein the temperature of the chuck supporting the silicon substrate is maintained in a range between −10° C. and +10° C. during the etching of the dielectric layer if the dielectric layer is a silicon oxide dielectric layer, and a range between −10° C. and +60° C. if the dielectric layer is a low-k dielectric layer.

28. The method as recited in claim 14, further comprising, prior to unloading the wafer from the process chamber:
   g) providing a post-etch treatment, comprising:
      providing a post-etch treatment gas into the chamber;
      forming a plasma from the post-etch treatment gas; and
      treating the wafer surface with the plasma formed from the post-etch treatment gas.

29. The method as recited in claim 28, wherein the plasma from the post-etch treatment gas removes the patterned mask remaining after completing said etching the silicon substrate, without removing the at least one patterned conductive layer and the at least one patterned dielectric layer.

30. The method of claim 14, wherein the silicon substrate is etched with a steady-state gas flow comprising $SF_6$, $O_2$, $SiF_4$, and HBr.

31. The method of claim 14, wherein the etching the silicon substrate etches through-silicon features into the at least two conductive layers, the at least two dielectric layers, and at least two silicon substrates so as to form through-silicon vias penetrating at least one of the silicon substrates and into another silicon substrate.

32. The method of claim 14, wherein the at least two conductive layer include a metal-containing conductive layer and a silicon containing conductive layer.

* * * * *